(12) United States Patent
Zhang

(10) Patent No.: US 8,542,337 B2
(45) Date of Patent: Sep. 24, 2013

(54) PIXEL STRUCTURE OF ACTIVE MATRIX ORGANIC LIGHT EMITTING DISPLAY AND MANUFACTURING THEREOF

(75) Inventor: Mi Zhang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 855 days.

(21) Appl. No.: 12/729,692

(22) Filed: Mar. 23, 2010

(65) Prior Publication Data

US 2010/0238095 A1   Sep. 23, 2010

(30) Foreign Application Priority Data

Mar. 23, 2009   (CN) .......................... 2009 1 0080830

(51) Int. Cl.
| | |
|---|---|
| G02F 1/1343 | (2006.01) |
| G02F 1/1345 | (2006.01) |
| G09G 3/06 | (2006.01) |
| G09G 3/12 | (2006.01) |
| G09G 3/14 | (2006.01) |
| G09G 3/20 | (2006.01) |
| H01L 27/118 | (2006.01) |
| H01L 23/52 | (2006.01) |
| H01L 21/82 | (2006.01) |

(52) U.S. Cl.
USPC ........... 349/139; 349/142; 349/143; 349/147; 349/149; 345/44; 345/45; 345/46; 345/55; 257/202; 257/204; 257/206; 257/207; 257/208; 257/E29.151; 257/E29.211; 438/129

(58) Field of Classification Search
None
See application file for complete search history.

(56) References Cited

U.S. PATENT DOCUMENTS

| | | | |
|---|---|---|---|
| 7,411,586 B2* | 8/2008 | Kimura .......................... | 345/214 |
| 2002/0190924 A1* | 12/2002 | Asano et al. .................... | 345/55 |
| 2010/0149089 A1* | 6/2010 | Kim ............................... | 345/107 |
| 2010/0188384 A1* | 7/2010 | Uchino et al. ................ | 345/211 |

FOREIGN PATENT DOCUMENTS

| | | |
|---|---|---|
| CN | 1459656 A | 12/2003 |
| CN | 101285974 A | 10/2008 |

* cited by examiner

Primary Examiner — Julio J Maldonado
Assistant Examiner — Harpreet Singh
(74) Attorney, Agent, or Firm — Ladas & Parry LLP

(57) ABSTRACT

An embodiment of the invention provides a pixel structure of an active matrix organic light emitting display comprising a gate line, a common electrode line, a signal line, a power line, a first thin film transistor which is used as an addressing element, and a second thin film transistor which controls the organic light emitting display. A short-circuit-ring structure is connected between the common electrode line and the signal line and the short-circuit-ring structure communicates the signal line and the common electrode line in the case where a large current flows.

19 Claims, 11 Drawing Sheets

A2 - A2

C2 - C2

D2 - D2

A3 - A3

C3 - C3

D3 - D3

PIXEL STRUCTURE OF ACTIVE MATRIX ORGANIC LIGHT EMITTING DISPLAY AND MANUFACTURING THEREOF

BACKGROUND

Embodiments of the present invention relate to a pixel structure of an active matrix organic light emitting display and a manufacturing thereof.

An Active matrix organic light emitting display (AMOLED), as a new type of flat panel display, has many superior characteristics over a liquid crystal display (LCD). For example, an AMOLED has a better view angle and a better contrast ratio than a liquid crystal display due to the light emitting function of an organic light emitting diode (OLED). Because there is no need to provide a back-light device as an external light source, an AMOLED is of a small size, less weight and lower power consumption. Because an AMOLED assumes a low direct current drive, it is of an advantage of fast response. Because an AMOLED employs solid material instead of liquid material used in a LCD, it exhibits better stability against external impact and can work in a much larger temperature range than that a LCD. In addition, an AMOLED has the advantages such as lower cost of production.

Currently, the conventional pixel structure of an AMOLED generally comprises a gate line, a signal line, a power line, a first pixel electrode and a second pixel electrode. The signal line and the power line are perpendicular to the gate line, and the gate line, the signal line and the power line define a pixel region collectively. A first thin film transistor (also called as a switching thin film transistor) is formed at the intersection of the adjacent signal line and the gate line, and the first thin film transistor is used for addressing of drive voltage. A second thin film transistor (also called a drive thin film transistor) is formed at the intersection of the adjacent power line and the gate line, and the second thin film transistor is used to control the work of the OLED. However, in operation, the conventional pixel structure of an AMOLED tends to concentrate a larger number of charges on the signal line, and an electrostatic breakdown tends to occur when the amount of the charges reaches a certain degree, leading to a short circuit of the signal line.

SUMMARY

One embodiment of the invention provides a pixel structure of an active matrix organic light emitting display comprising a gate line, a common electrode line, a signal line, a power line, a first thin film transistor which is used as an addressing element, and a second thin film transistor which controls an organic light emitting diode, wherein a short-circuit-ring structure is connected between the common electrode line and the signal line and the short-circuit-ring structure communicates the signal line and the common electrode line in the case where a large current flows.

Another embodiment of the invention provides a manufacturing method of a pixel structure of an active matrix organic light emitting display comprising: Step 1, depositing films to be patterned on a substrate, forming a gate line, a common electrode line, a signal line, a first thin film transistor, a first pixel electrode and a short-circuit-ring structure, the short-circuit-ring structure being disposed between the signal line and the common electrode line; and Step 2, depositing films to be patterned on the substrate, forming a power line, a second thin film transistor and a second pixel electrode, the first pixel electrode being used as a gate electrode of the second thin film transistor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

The embodiments of the invention will be further described with reference to the accompanying drawings.

Figure 1:
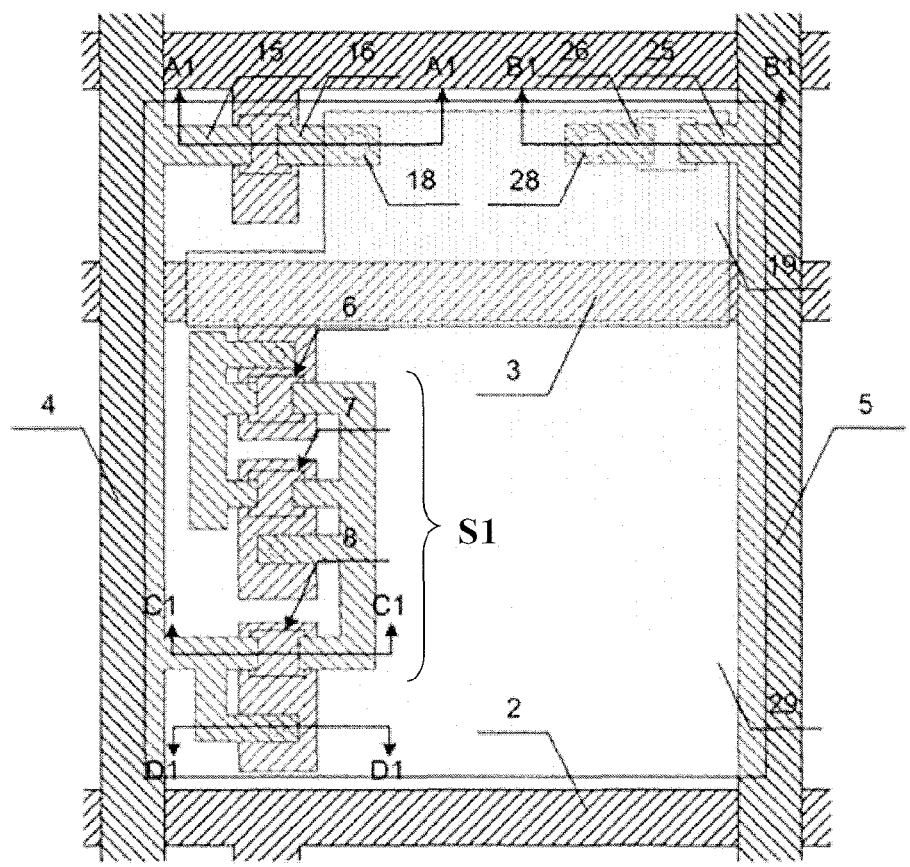
FIG. 1 is a planar view of a pixel structure of a active matrix organic light emitting display (AMOLED) according to an embodiment of the invention.
Figure 2:
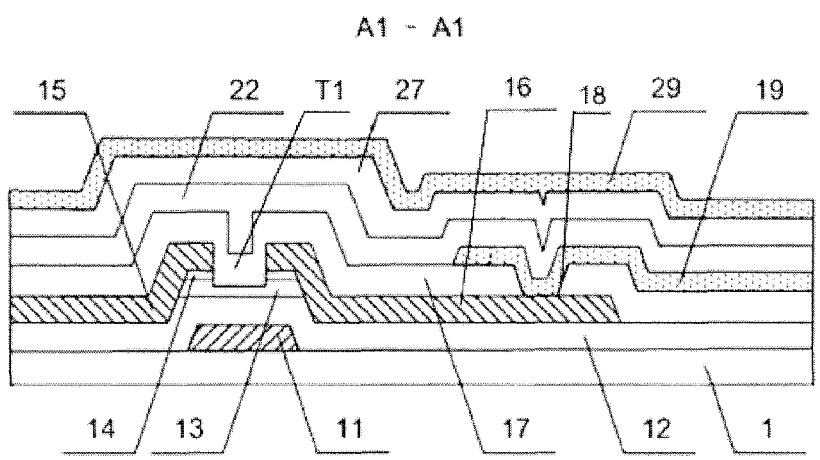
FIG. 2 is a cross-sectional view taken along the line A1-A1 in FIG. 1.
Figure 3:
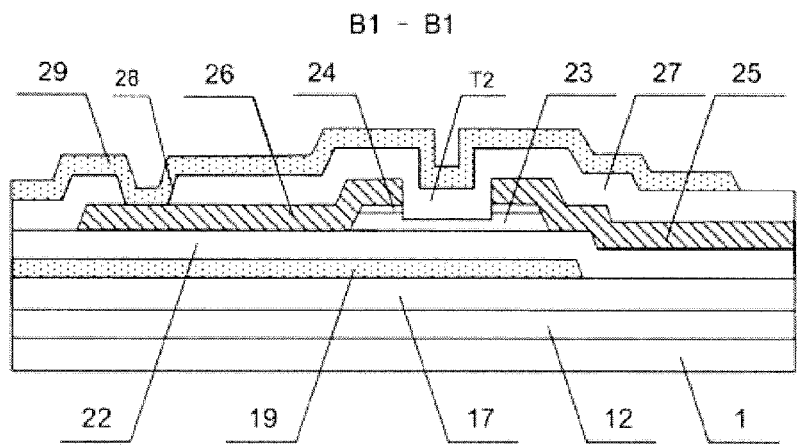
FIG. 3 is a cross-sectional view taken along the line B1-B1 in FIG. 1.
Figure 4:
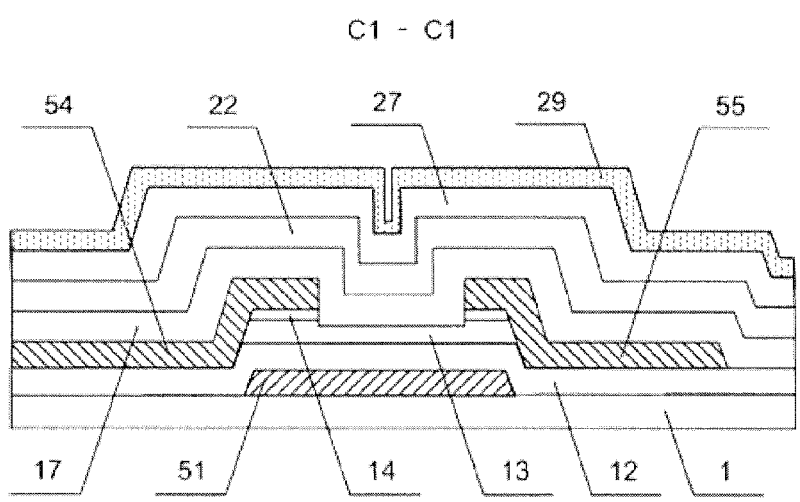
FIG. 4 is a cross-sectional view taken along the line C1-C1 in FIG. 1.
Figure 5:
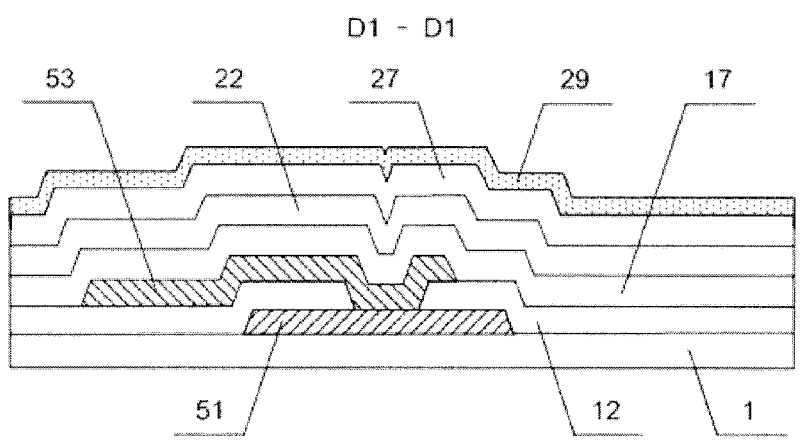
FIG. 5 is a cross-sectional view taken along the line D1-D1 in FIG. 1.

FIG. 1 is a planar view of a pixel structure of an active matrix organic light emitting display (AMOLED) according to an embodiment of the invention, showing the structure of one pixel unit; FIG. 2 is a cross-sectional view taken along the line A1-A1 in FIG. 1; FIG. 3 is a cross-sectional view taken along the line B1-B1 in FIG. 1; FIG. 4 is a cross-sectional view taken along the line C1-C1 in FIG. 1; FIG. 5 is a cross-sectional view taken along the line D1-D1 in FIG. 1.

As shown in FIGS. 1~5, the pixel structure of the AMOLED according to the embodiment of the invention comprises a gate line 2, a common electrode line 3 and a signal line 4, a power line 5 and a short-circuit-ring structure S1. The signal line 4 and the power line 5 are perpendicular to the gate line 2 and define a pixel region together with the gate line 2. A first thin film transistor (also called a switch thin film transistor) as an addressing element, a first pixel electrode 19, a second thin film transistor (also called a drive thin film transistor) used for controlling an organic light emitting diode (OLED), and a second pixel electrode 29 are formed in the pixel region. The first pixel electrode 19 is also used as the gate electrode of the second thin film transistor. The first thin film transistor (TFT) is located at the intersection of the gate line 2 and the signal line 4, and the second thin film transistor is located at the intersection of the gate line 2 and the power line 5. The short-circuit-ring structure S1 is disposed between the common electrode line 3 and the signal line 4. When there is a large current, due to electrostatic discharge, flowing through the signal line 4, the large current in the signal line 4 can be quickly conducted into the common electrode line 3 though the short-circuit-ring structure S1 so as to release the charges concentrated on the signal line 4, avoiding electrostatic breakdown and preventing the signal line 4 and the first thin film transistor from being damaged. The first, second TFTs and the short-circuit-ring structure S1 are described as follows.

The first thin film transistor comprises a first gate line 11, a first active layer (a first semiconductor layer 13 and a first doped semiconductor layer 14 as an ohmic contact layer), a first source electrode 15, a first drain electrode 16 and a first TFT channel region. The first gate line 11 is formed on a substrate 1 and connected with the gate line 2 with a first insulating layer 12 covering them. The first active layer is formed on the first insulating layer 12 and located above the first gate line 11. One end of the first source electrode 15 is located on the first active layer, and the other end is connected with the signal line 4. One end of the first drain electrode 16 is located on the first active layer and disposed oppositely to the first source electrode 15. The first TFT channel region is formed between the first source electrode 15 and the first drain electrode 16. A second insulating layer 17 is formed on the signal line 4, the first source electrode 15 and the first drain electrode 16 and covers the whole substrate 1 with a first though hole 18 formed at the position corresponding to the first drain electrode 16. The first pixel electrode 19 is formed on the second insulating layer 17 and connected with the first drain electrode 16 via the through hole 18, and also used as a gate electrode of the second thin film transistor. The second thin film transistor comprises the first pixel electrode 19, a second active layer (a second semiconductor layer 23 and a second doped semiconductor layer 24 as an ohmic contact layer), a second source electrode 25, a second drain electrode 26 and a second TFT channel region. The first pixel electrode 19 is used as the gate electrode of the second thin film transistor with a third insulating layer 22 covered them. The second active layer is formed on the third insulating layer 22 and located above the first pixel electrode 19. One end of the second source 25 is located on the second active layer, and the other end is connected with the power line 5. One end of the second drain electrode 26 is located on the second active layer and disposed oppositely to the second source electrode 25. The second TFT channel region is disposed between the second source electrode 25 and the second drain electrode 26. The fourth insulating layer 27 is formed on the power line 5, the second source electrode 25 and the second drain electrode 26 and covers the whole substrate 1 with a second through hole 28 provided at a position corresponding to the second drain electrode 26. A second pixel electrode 29 is formed on the fourth insulating layer 27 and connected with the second drain electrode 29 via the through hole 28.

The short-circuit-ring structure may comprise the third thin film transistor only, the common electrode line is connected with a gate electrode and a source electrode of the third thin film transistor, and the signal line is connected with a drain electrode of the third thin film transistor, thus the short-circuit-ring structure can communicate the common electrode line and the signal line in the case where a large current flows through the common electrode line due to electrostatic discharge so as to conduct the large current from the common electrode line to the signal line. Alternatively, the short-circuit-ring structure comprises the fifth thin film transistor only, the signal line is connected with a gate electrode and a source electrode of the fifth thin film transistor, and the common electrode line is connected with a drain electrode of the fifth thin film transistor, thus the short-circuit-ring structure can communicate the common electrode line and the signal line in the case where a large current flows through the signal line due to electrostatic discharge so as to conduct the large current from the signal line to the common electrode line.

The short-circuit-ring structure S1 comprises at least two thin film transistors, which are connected sequentially, between the common electrode line 3 and the signal line 4. When the short-circuit-ring structure S1 comprises two thin film transistors, for example, the third thin film transistor 6 and the fifth thin film transistor 8 as shown in FIG. 1, in which case the common electrode line 3 is connected with a third gate electrode and a third source electrode of the third thin film transistor 6, the signal line is connected with a fifth gate electrode and a fifth source electrode of the fifth thin film transistor 8, and a first drain electrode of the third thin film transistor 6 is connected with a fifth drain electrode of the fifth thin film transistor 8, thus the large current due to electrostatic discharge on the common line can be conducted to the signal line and the large current due to electrostatic discharge on the signal line can be conducted to the common electrode line also. When the short-circuit-ring structure S1 comprises three thin film transistors, as shown in FIG. 1, the three thin film transistors comprise a third thin film transistor 6, a fourth thin film transistor 7 and a fifth thin film transistor 8, respectively. The common electrode line 3 is connected with a third gate electrode and a third source electrode of the third thin film transistor 6, the signal line 4 is connected with a fifth gate electrode and a fifth source electrode of the fifth thin film transistor 8, and the fourth thin film transistor 7 is connected between the third thin film transistor 6 and the fifth thin film transistor 8.

FIGS. 6~33 are schematic view showing the manufacturing process of the pixel structure of the AMOLED according to the embodiment of the invention. In the following description, the patterning process in the embodiments of the invention comprises the processes such as applying photoresist, masking, exposing and developing photoresist, etching with photoresist pattern, and removing the photoresist. A positive photoresist is used as an example.

Figure 6:
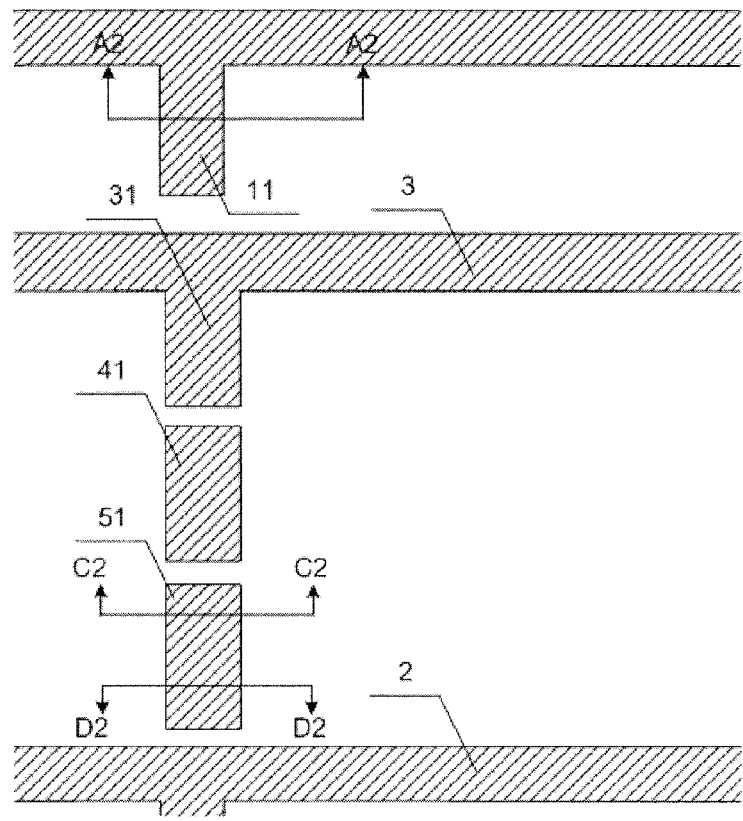
FIG. 6 is a planar view of the pixel structure of an AMOLED after a first patterning process according to the embodiment of the invention.
Figure 7:
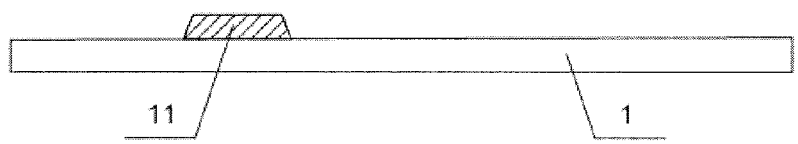
FIG. 7 is a cross-sectional view taken along the line A2-A2 in FIG. 6.
Figure 8:
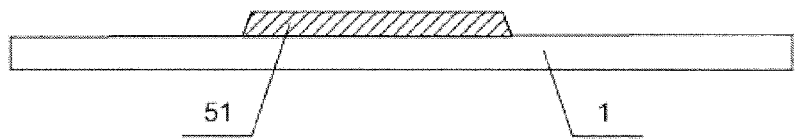
FIG. 8 is a cross-sectional view taken along the line C2-C2 in FIG. 6.
Figure 9:
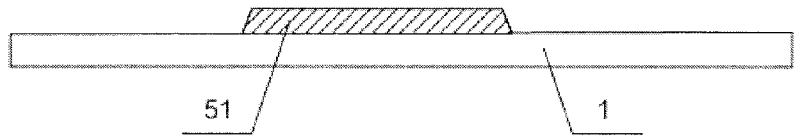
FIG. 9 is a cross-sectional view taken along the line D2-D2 in FIG. 6.

FIG. 6 is a planar view of the pixel structure of an AMOLED after a first patterning process according to the embodiment of the invention, showing the structure of one pixel unit. FIG. 7 is a cross-sectional view taken along the line A2-A2 in FIG. 6, FIG. 8 is a cross-sectional view taken along the line C2-C2 in FIG. 6, and FIG. 9 is a cross-sectional view taken along the line D2-D2 in FIG. 6.

By a magnetron sputtering or thermal evaporation method, a first metal film is deposited on a substrate 1 (such as a glass substrate or a silica substrate). The first metal film may employ a single metal layer composed of a metal such as aluminum, chromium, tungsten, tantalum, titanium, molybdenum or aluminum-nickel alloy, or may be a composite structure of multiple metal layers composed by the above mentioned materials. The first metal film is patterned by a patterning process with a normal mask so as to form a gate line 2, a common electrode line 3, a first gate electrode 11, a third gate electrode 31, a fourth gate electrode 41 and a fifth gate electrode 51. The first gate electrode 11, as a gate electrode of a first thin film transistor, is connected with the gate line 2; the common electrode line 3, also as one electrode plate of a storage capacitance, is disposed between two adjacent gate line 2; the third gate electrode 31 is connected with the common electrode line 3; and the fourth gate electrode 41 and the fifth gate electrode 51 are disposed in this order on one side of the third gate electrode 31, as shown in FIGS. 6~9.

Figure 10:
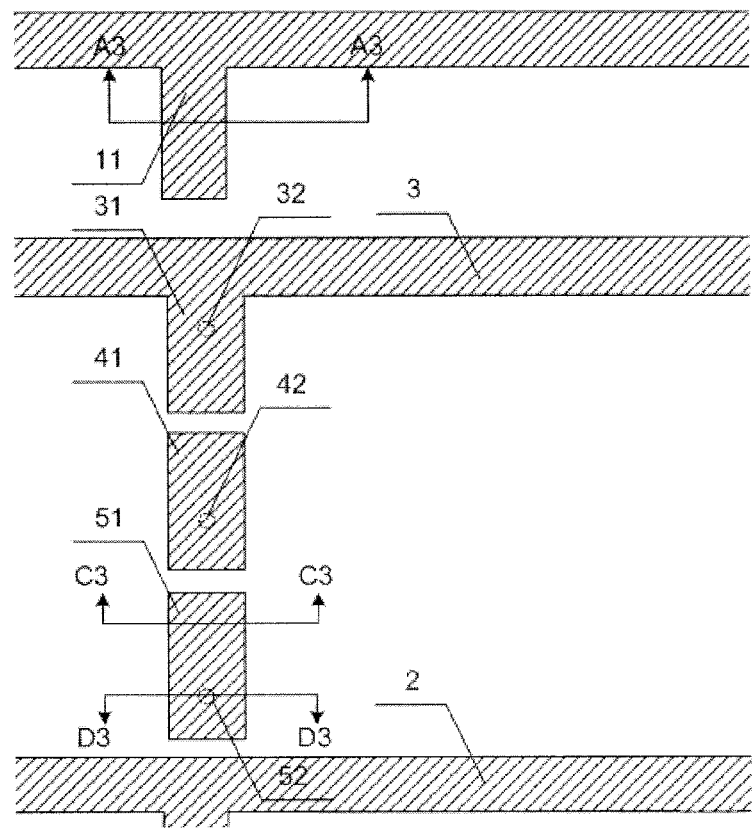
FIG. 10 is a planar view of the pixel structure of an AMOLED after a second patterning process according to the embodiment of the invention.
Figure 11:
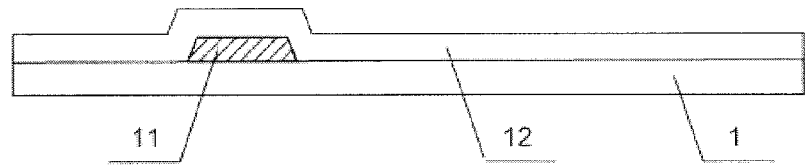
FIG. 11 is a cross-sectional view taken along the line A3-A3 in FIG. 10.
Figure 12:
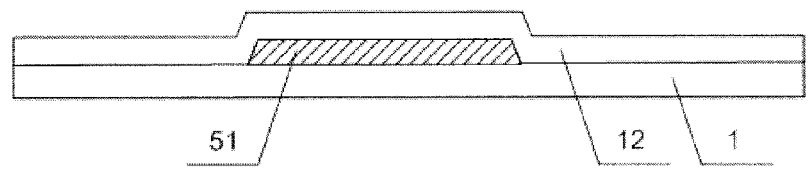
FIG. 12 is a cross-sectional view taken along the line C3-C3 in FIG. 10.
Figure 13:
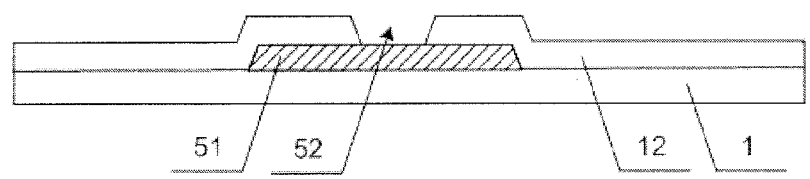
FIG. 13 is a cross-sectional view taken along the line D3-D3 in FIG. 10.

FIG. 10 is a planar view of the pixel structure of an AMOLED after a second patterning process according to the embodiment of the invention, showing the structure of one pixel unit. FIG. 11 is a cross-sectional view taken along the line A3-A3 in FIG. 10; FIG. 12 is a cross-sectional view taken along the line C3-C3 in FIG. 10; FIG. 13 is a cross-sectional view taken along the line D3-D3 in FIG. 10.

On the substrate after forming the above patterns, a first insulating layer 12, which can employ a material such as silicon nitride, silicon oxide or aluminum oxide, is deposited by a plasma enhanced chemical vapor deposition (PECVD) method, and is patterned by a first patterning process with a normal mask, so as to form a third through hole 32, a fourth through hole 42 and a fifth through hole 52. The third through hole 32 is located at a position corresponding to the third gate electrode 31, the fourth through hole 42 is located at a position corresponding to the fourth gate electrode 41, and a fifth through hole 52 is located at a position corresponding to the fifth gate electrode 51. The material of the first insulating layer at the third through hole 32, the fourth through hole 42 and the fifth through hole 52 is etched away, so as to expose the surfaces of the third gate electrode 31, the fourth gate electrode 41 and the fifth gate electrode 51, as shown in FIGS. 10~13.

Figure 14:
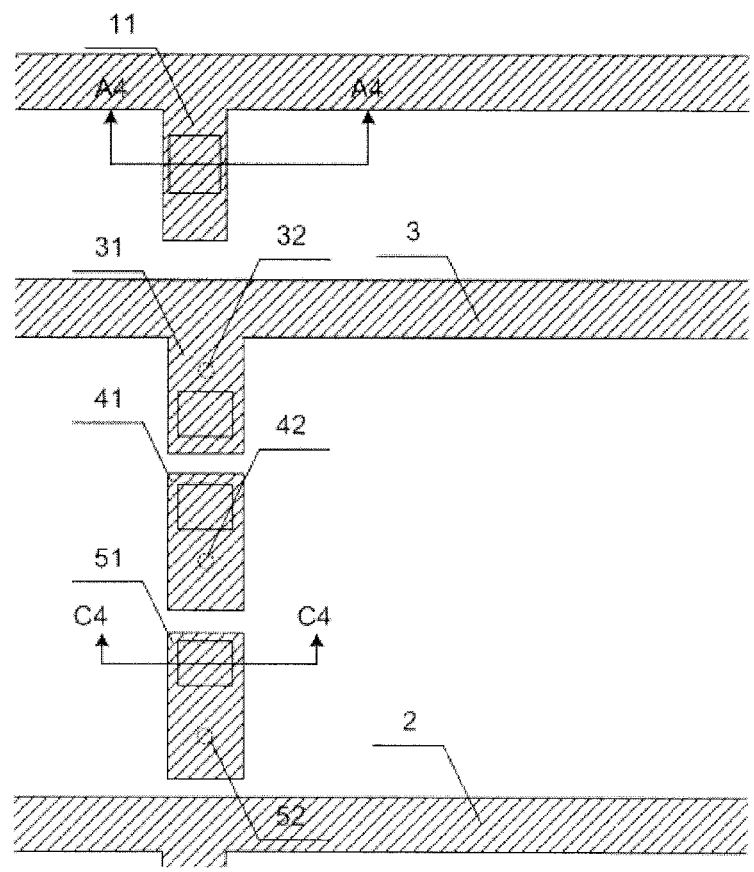
FIG. 14 is a planar view of the pixel structure of an AMOLED after a third patterning process according to the embodiment of the invention.
Figure 15:
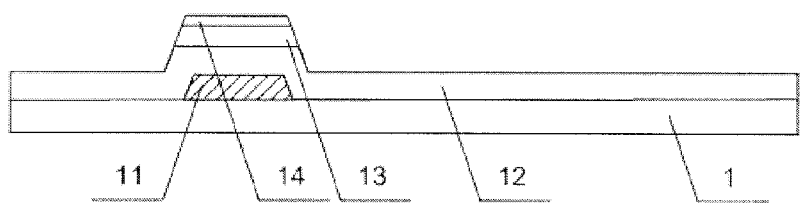
FIG. 15 is a cross-sectional view taken along the line A4-A4 in FIG. 14.
Figure 16:
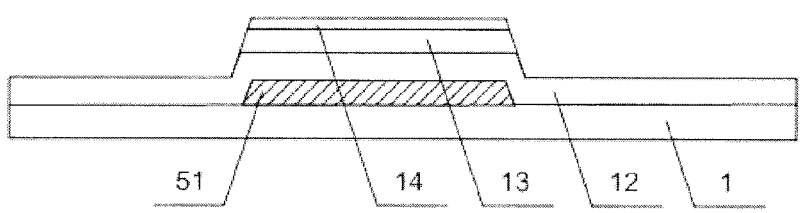
FIG. 16 is a cross-sectional view taken along the line C4-C4 in FIG. 14.

FIG. 14 is a planar view of the pixel structure of an AMOLED after a third patterning process according to the embodiment of the invention, showing the structure of one pixel unit. FIG. 15 is a cross-sectional view taken along the line A4-A4 in FIG. 14, and FIG. 16 is a cross-sectional view taken along the line C4-C4 in FIG. 14.

On the substrate after forming the above patterns, a first semiconductor film and a first doped semiconductor film are sequentially deposited by a PECVD method and are patterned by a patterning process with a normal mask, so as to form a first active layer, a third active layer, a fourth active layer and a fifth active layer. The first active layer is located above the first gate electrode 11, the third active layer is located above the third gate electrode 51, and the fourth active layer is located above the fourth gate electrode 41, and the fifth active layer is located above the fifth gate electrode 51. Each active layer comprises a first semiconductor layer 13 obtained by patterning the first semiconductor film and a second doped semiconductor layer 14 obtained by patterning the first doped semiconductor film, as shown in FIGS. 14~16. After the patterning process, the first insulating layer 12 is exposed in regions except the first, third and fourth active layers.

Figure 17:
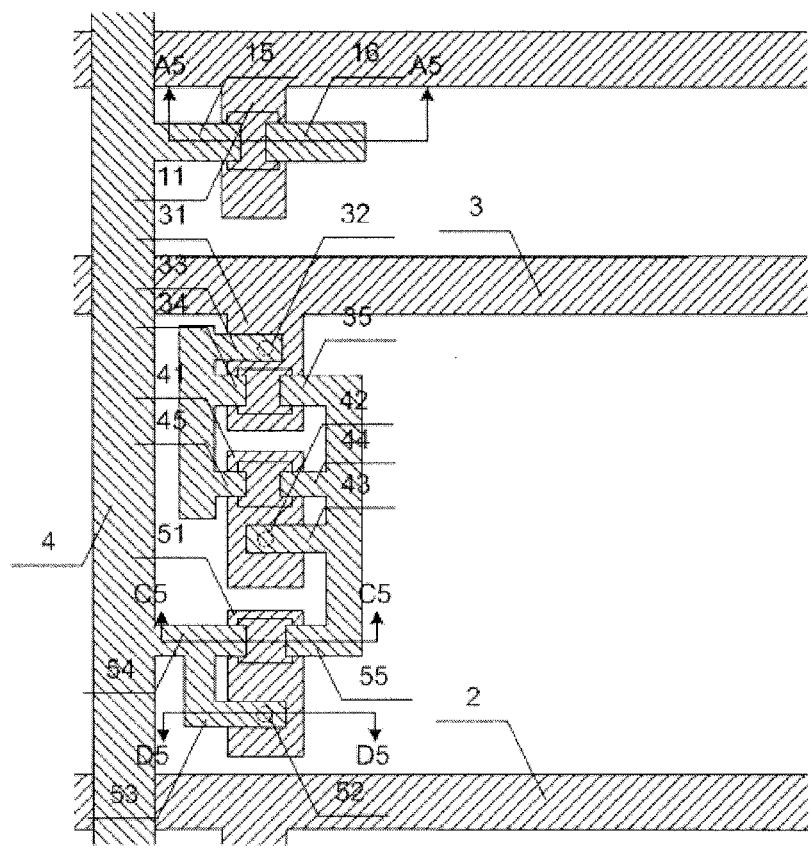
FIG. 17 is a planar view of the pixel structure of an AMOLED after a fourth patterning process according to the embodiment of the invention.
Figure 18:
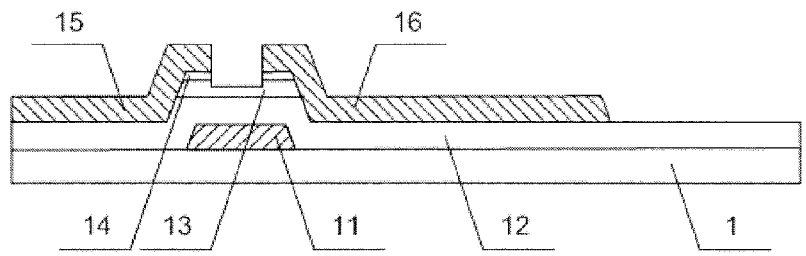
FIG. 18 is a cross-sectional view taken along the line A5-A5 in FIG. 17.
Figure 19:
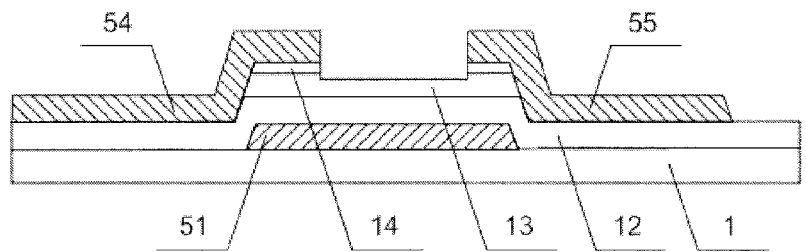
FIG. 19 is a cross-sectional view taken along the line C5-C5 in FIG. 17.
Figure 20:
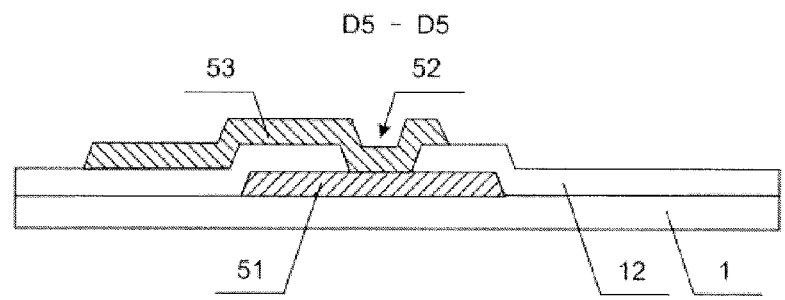
FIG. 20 is a cross-sectional view taken along the line D5-D5 in FIG. 17.

FIG. 17 is a planar view of the pixel structure of an AMOLED after a fourth patterning process according to the embodiment of the invention, showing the structure of one pixel unit. FIG. 18 is a cross-sectional view taken along the line A5-A5 in FIG. 17; FIG. 19 is a cross-sectional view taken along the line C5-C5 in FIG. 17; FIG. 20 is a cross-sectional view taken along the line D5-D5 in FIG. 17.

On the substrate after forming the above patterns, a second metal film is deposited by a magnetron sputtering or thermal evaporation method. The second metal film may be a single layer composed of metals such as aluminum, chromium, tungsten, tantalum, titanium, molybdenum or aluminum nickel, or may be a composite structure of multiple metal layers composed of any combination of the above materials. The second metal film is patterned by a patterning process with a normal mask, so as to form a signal line 4, the source/drain electrodes of the first thin film transistor, the source/drain electrodes of the third thin film transistor, the source/drain electrodes of the fourth thin film transistor, the source/drain electrodes of the fifth thin film transistor, a third connecting electrode 33, a fourth connecting electrode 43 and a fifth connecting electrode 53, as shown in FIGS. 17~20.

The source/drain electrodes of the first thin film transistor comprise a first source electrode 15 and a first drain electrode 16. One end of the first source electrode 15 is disposed on the first active layer, and the other end is connected with the signal line 4. One end of the first drain electrode 16 is disposed on the first active layer and disposed oppositely to the first source electrode 15. A first TFT channel region is formed between the first source electrode 15 and the first drain electrode 16. The first doped semiconductor layer 14 in the first TFT channel region is etched away and the first semiconductor layer 13 is etched partially in the thickness direction so that the first semiconductor layer 13 in the first TFT channel region is exposed. The source/drain electrodes of the fifth thin film transistor comprise a fifth source electrode 54 and a fifth drain electrode 55. One end of the fifth connecting electrode 53 is connected with the signal line 4, and the other end is located above the fifth gate electrode 51 and connected with the fifth gate electrode 51 via the fifth through hole 52. One end of the fifth source electrode 54 is located on the fifth active layer, and the other end is connected with the signal line 4. One end of the fifth drain electrode 55 is located on the fifth active layer and disposed oppositely to the fifth source electrode 54. A fifth TFT channel region is formed between the fifth source electrode 54 and the fifth drain electrode 55. The first doped semiconductor layer 14 in the fifth TFT channel region is etched away and the first semiconductor layer 13 is etched partially in the thickness direction so that the first semiconductor layer 13 in the fifth TFT channel region is exposed. The source/drain electrodes of the fourth thin film transistor comprise a fourth source electrode 44 and a fourth drain electrode 45. One end of the fourth connecting electrode 43 is connected with the fifth drain electrode 55, and the other end is located above the fourth gate electrode 41 and connected with fourth gate electrode 41 via the fourth through hole 42. One end of the fourth source electrode 44 is located on the fourth active layer, and the other end is connected with the fifth drain electrode 55. One end of the fourth drain electrode 45 is located on the fourth active layer and disposed oppositely to the fourth source electrode 44. A fourth TFT channel region is formed between the fourth source electrode 44 and the fourth drain electrode 45. The first doped semiconductor layer 14 in the fourth TFT channel region is etched away and the first semiconductor layer 13 is etched partially in the thickness direction so that the first semiconductor layer 13 in the fourth TFT channel region is exposed. The source/drain electrodes of the third thin film transistor comprise a third source electrode 34 and a third drain electrode 35. One end of the third connecting electrode 33 is connected with the fourth drain electrode 45, and the other end is located above the third gate electrode 31 and connected with third gate electrode 31 via the third through hole 32. One end of the third source electrode 34 is located on the third active layer, and the other end is connected with the fourth drain electrode 45. One end of the third drain electrode 35 is located on the third active layer and disposed oppositely to the third source electrode 34. A third TFT channel region is formed between the third source electrode 34 and the third drain electrode 35. The first doped semiconductor layer 14 in the third TFT channel region is etched away and the first semiconductor layer 13 is etched partially in the thickness direction so that the first semiconductor layer 13 in the third TFT channel region is exposed.

After this patterning process, the first thin film transistor is formed at the intersection of the gate line 2 and the signal line 4, and the third thin film transistor 6, the fourth thin film transistor 7 and the fifth thin film transistor 8, which are used as a short-circuit-ring structure S1, are formed in the pixel region. The fifth gate electrode 51 and the fifth source electrode 54 of the fifth thin film transistor 8 are connected with the signal line 4, the fourth gate electrode 41 and the fourth source electrode 44 of the fourth thin film transistor are connected with the fifth drain electrode 55, the third gate electrode 31 and the third source electrode 34 of the third thin film transistor are connected with the fourth drain electrode 45, and the third gate electrode 31 is connected with the common electrode line 3, so that the third, fourth and fifth thin film transistors constitute the short-circuit-ring structure S1 between the signal line 4 and the common electrode line 3.

Figure 21:
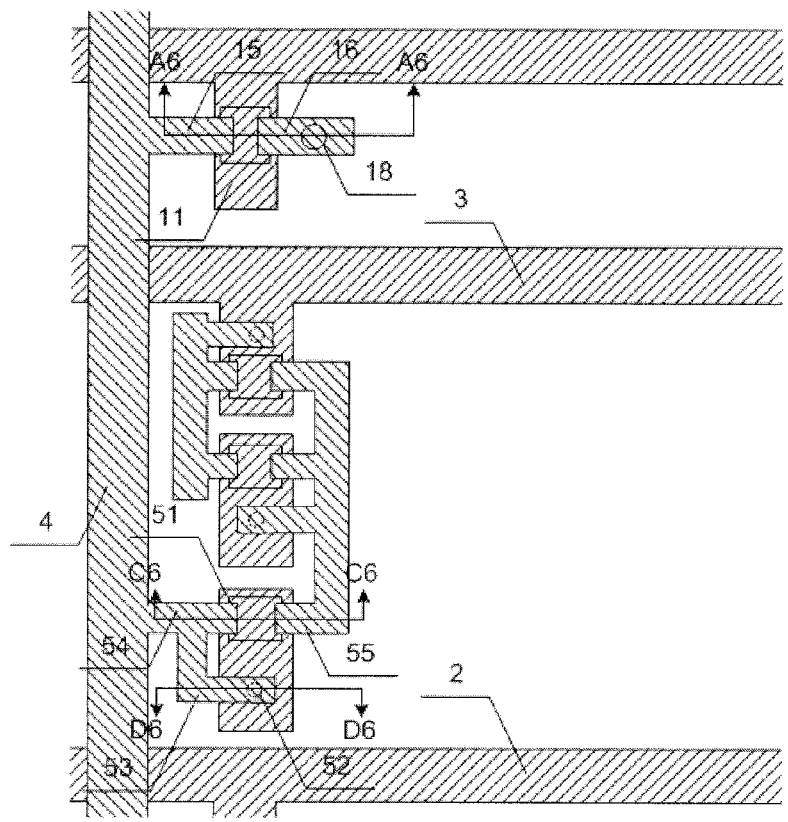
FIG. 21 is a planar view of the pixel structure of an AMOLED after a fifth patterning process according to the embodiment of the invention.
Figure 22:
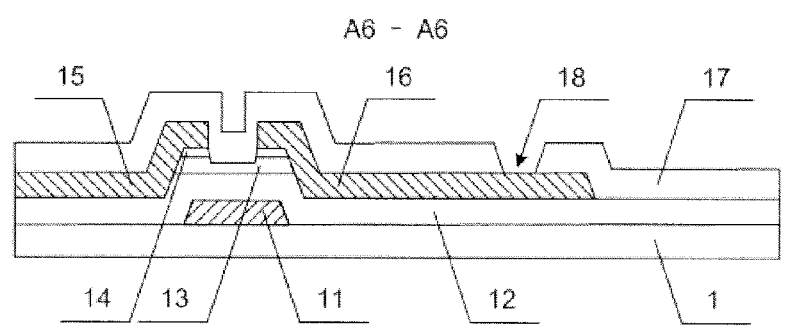
FIG. 22 is a cross-sectional view taken along the line A6-A6 in FIG. 21.
Figure 23:
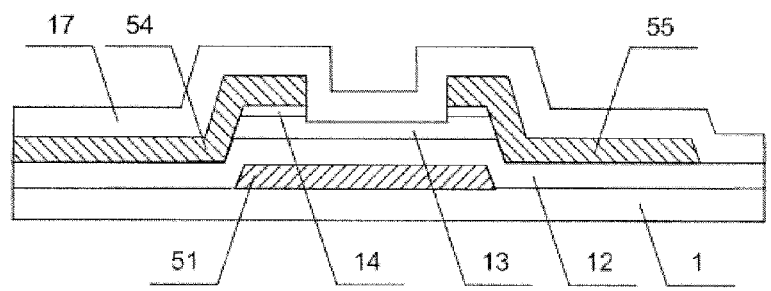
FIG. 23 is a cross-sectional view taken along the line C6-C6 in FIG. 21.
Figure 24:
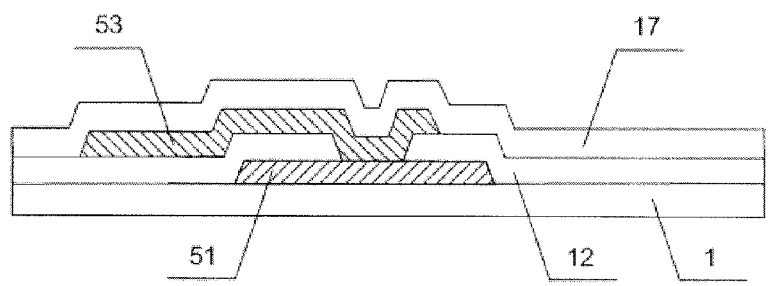
FIG. 24 is a cross-sectional view taken along the line D6-D6 in FIG. 21.

FIG. 21 is a planar view of the pixel structure of an AMOLED after a fifth patterning process according to the embodiment of the invention, showing a structure of one pixel region. FIG. 22 is a cross-sectional view taken along the line A6-A6 in FIG. 21; FIG. 23 is a cross-sectional view taken along the line C6-C6 in FIG. 21; FIG. 24 is a cross-sectional view taken along the line D6-D6 in FIG. 21.

On the substrate after forming the above patterns, a second insulating layer 17, which can employ a material such as silicon nitride, silicon oxide and aluminum oxide, is deposited by a PECVD method. The second insulating layer 17 is patterned by a patterning process with a normal mask so as to form a first through hole 18 which is located at a position corresponding to the first drain electrode 16. The first insulating layer at the first through hole 18 is etched away so as to expose the surface of the first drain electrode 16, as shown in FIGS. 21~24.

Figure 25:
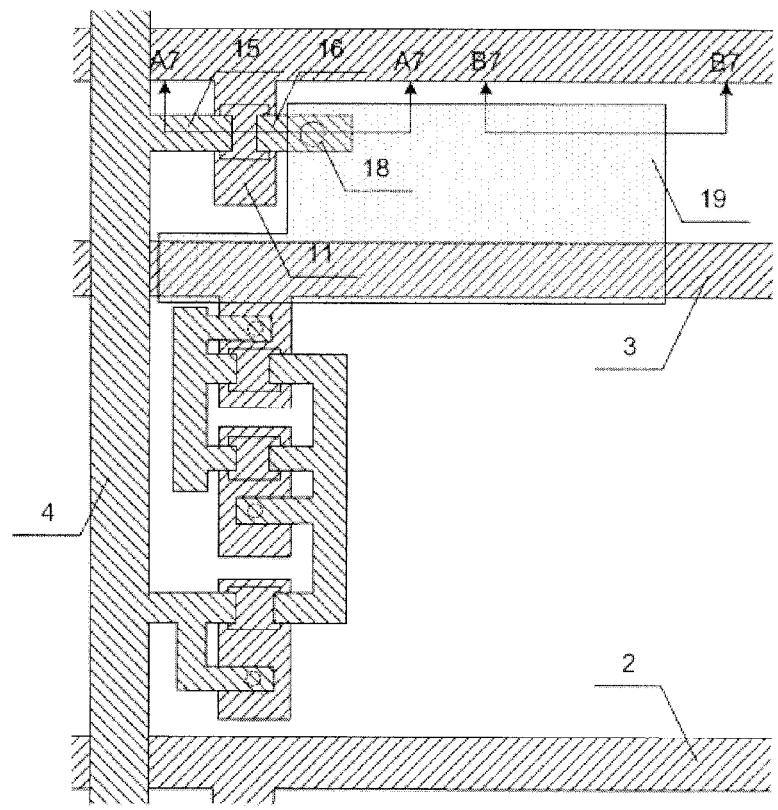
FIG. 25 is a planar view of the pixel structure of an AMOLED after a sixth patterning process according to the embodiment of the invention.
Figure 26:
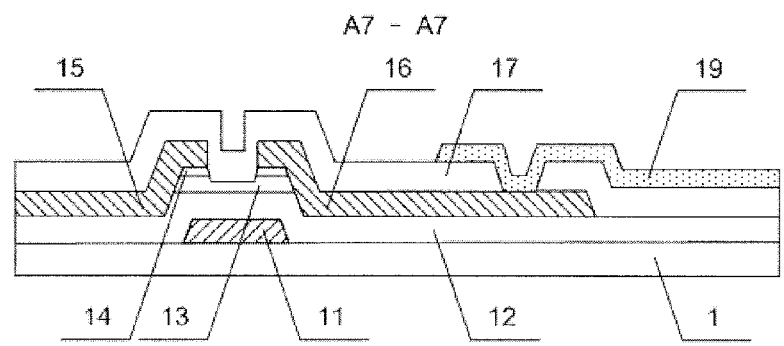
FIG. 26 is a cross-sectional view taken along the line A7-A7 in FIG. 25.
Figure 27:
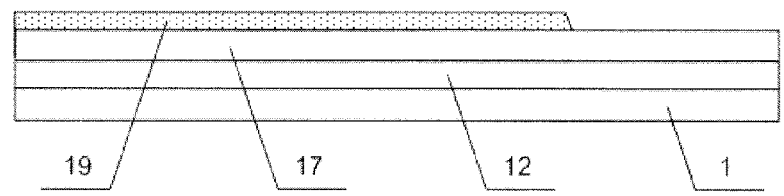
FIG. 27 is a cross-sectional view taken along the line B7-B7 in FIG. 25.

FIG. 25 is a planar view of the pixel structure of an AMOLED after a sixth patterning process according to the embodiment of the invention, showing the structure of one pixel unit. FIG. 26 is a cross-sectional view taken along the line A7-A7 in FIG. 25; and FIG. 27 is a cross-sectional view taken along the line B7-B7 in FIG. 25.

On the substrate after forming the above patterns, a first transparent conductive film is deposited by a magnetron sputtering or thermal evaporation method. The first transparent conductive film may employ s material such as indium tin oxide (ITO), indium zinc oxide (IZO) or aluminum zinc oxide (AZO), or may employ other transparent conductive material. The transparent conductive film is patterned by a patterning process with a normal mask so as to form a first pixel electrode 19 which is connected with the first drain electrode 16 via the first through hole 18, as shown in FIGS. 23~27.

Figure 28:
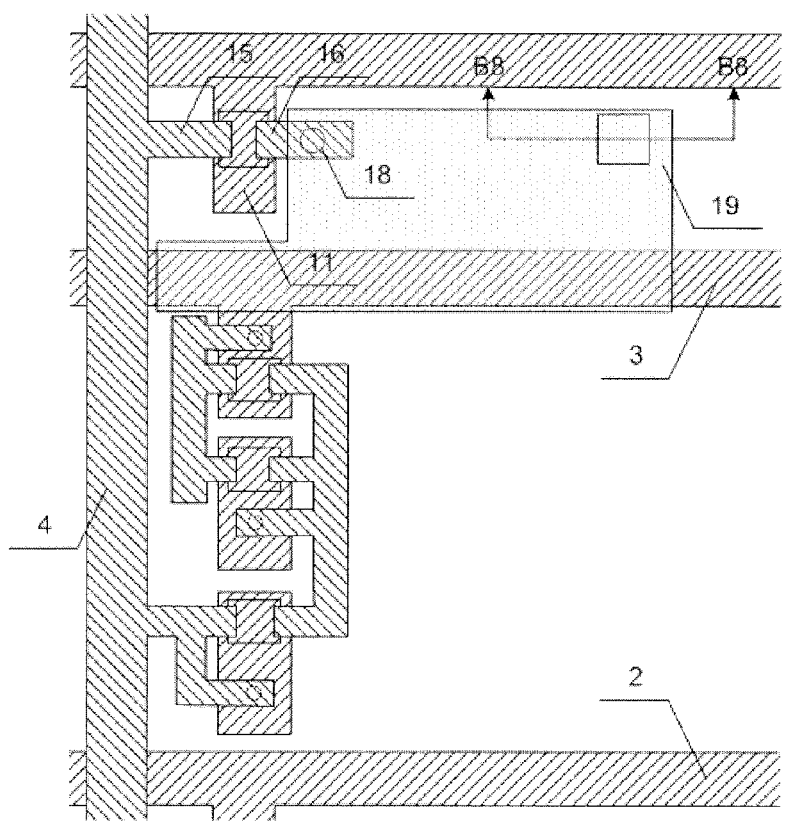
FIG. 28 is a planar view of the pixel structure of an AMOLED after a seventh patterning process according to the embodiment of the invention.
Figure 29:
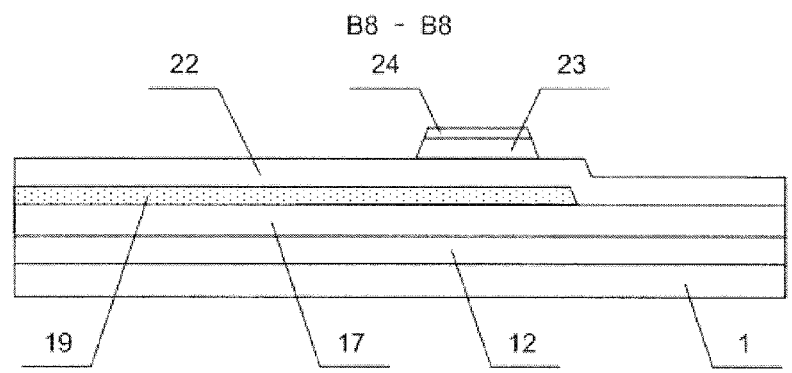
FIG. 29 is a cross-sectional view taken along the line B8-B8 in FIG. 28.

FIG. 28 is a planar view of the pixel structure of an AMOLED after a seventh patterning process according to the embodiment of the invention, showing the structure of one pixel unit. FIG. 29 is a cross-sectional view taken along the line B8-B8 in FIG. 28.

On the substrate after forming the above patterns, a third insulating layer 22, a second semiconductor film and a second doped semiconductor film as an ohmic contact layer are deposited by a PECVD method. The third insulating layer 22 may employ a material such as silicon nitride, silicon oxide and aluminum oxide. The second active layer (comprising the second semiconductor layer 23 and the second doped semiconductor layer 24) is formed by a patterning process with a normal mask on the first pixel region 19 used as the gate electrode, as shown in FIGS. 28 and 29.

Figure 30:
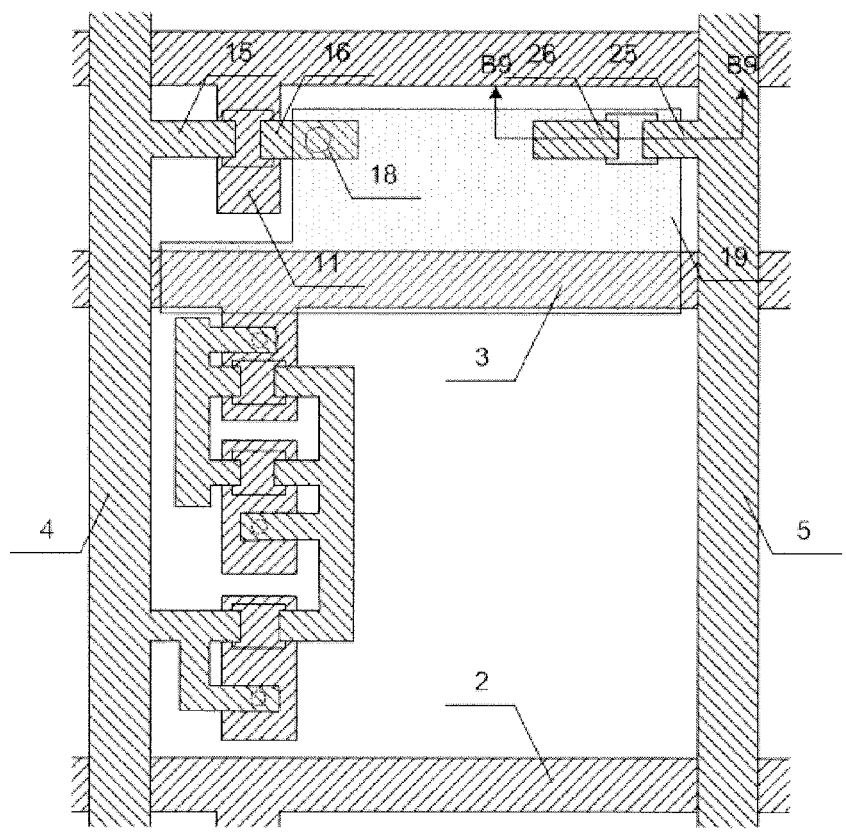
FIG. 30 is a planar view of the pixel structure of an AMOLED after a eighth patterning process according to the embodiment of the invention.
Figure 31:
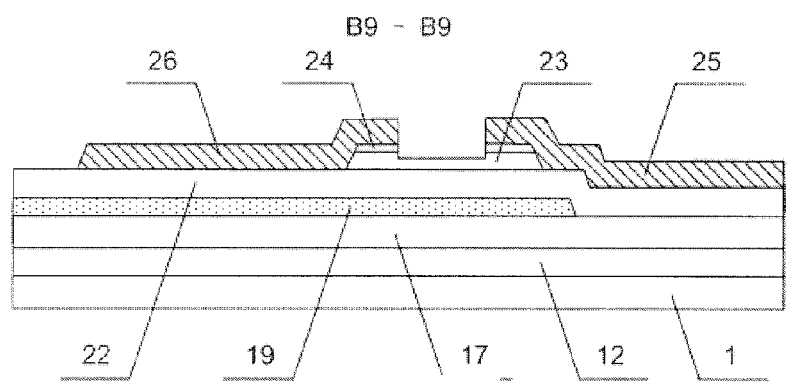
FIG. 31 is a cross-sectional view taken along the line B9-B9 in FIG. 30.

FIG. 30 is a planar view of the pixel structure of an AMOLED after a eighth patterning process according to the embodiment of the invention, showing the structure of one pixel unit. FIG. 31 is a cross-sectional view taken along the line B9-B9 in FIG. 30.

On the substrate after forming the above patterns, a third metal film is deposited by a sputtering or thermal evaporation method. The third metal film may be a single layer composed of aluminum, chromium, tungsten, tantalum, titanium, molybdenum or aluminum nickel, or may be a composite structure of multiple metal layers composed of any combination of the above materials. The third metal film is patterned by a patterning process with a normal mask so as to form a power line 5, a second drain electrode 25, a second drain electrode 26 and a second TFT channel region. One end of the second source electrode 25 is disposed on the second active layer, and the other end is connected with the power line 5. One end of the second drain electrode 26 is located on the second active layer and disposed oppositely to the second source electrode 25. A second TFT channel region is formed between the second source electrode 25 and the second drain electrode 26. The first doped semiconductor layer 24 in the second TFT channel region is etched away and the first semiconductor layer 23 is etched partially in the thickness direction so that the first semiconductor layer 23 in the second TFT channel region is exposed, as shown in FIGS. 30 and 31. Thus, a second thin film transistor used to controlling the OLED is formed at the intersection of the gate line 2 and the power line 5. The second thin film transistor comprises the first pixel electrode 19, the second active layer, the second source electrode 25, the second drain electrode 26 and the second TFT channel region. The first pixel electrode 19 is used as the gate electrode of the second thin film transistor.

Figure 32:
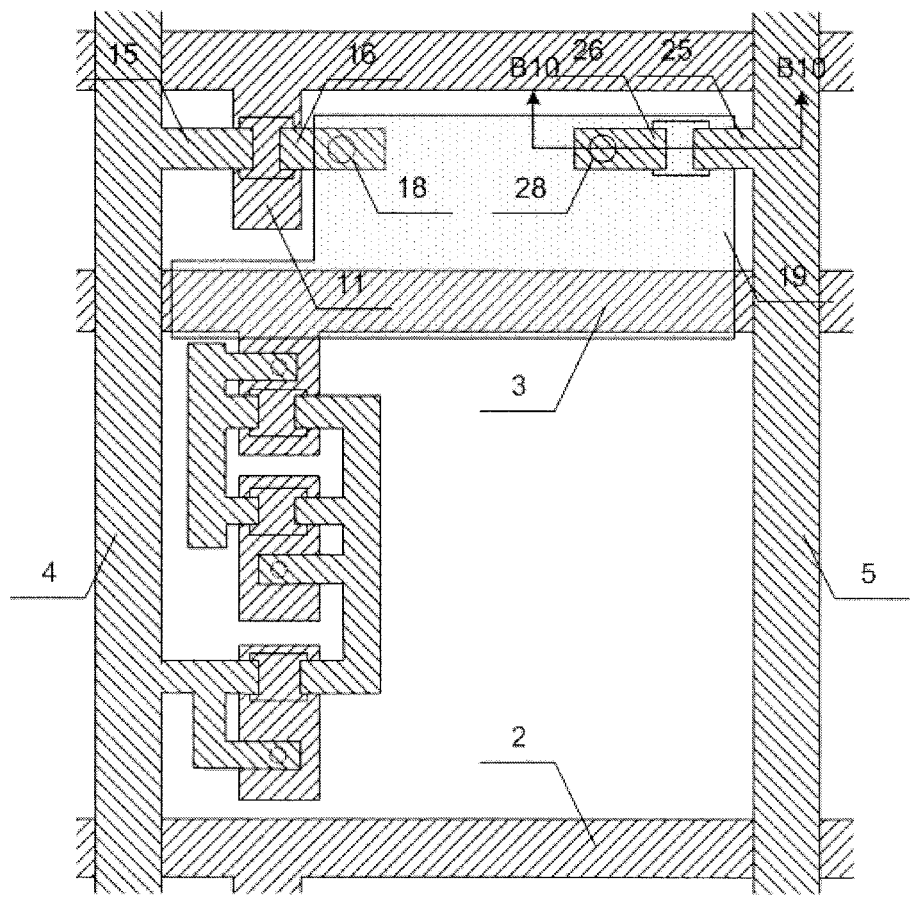
FIG. 32 is a planar view of the pixel structure of an AMOLED after a ninth patterning process according to the embodiment of the invention.
Figure 33:
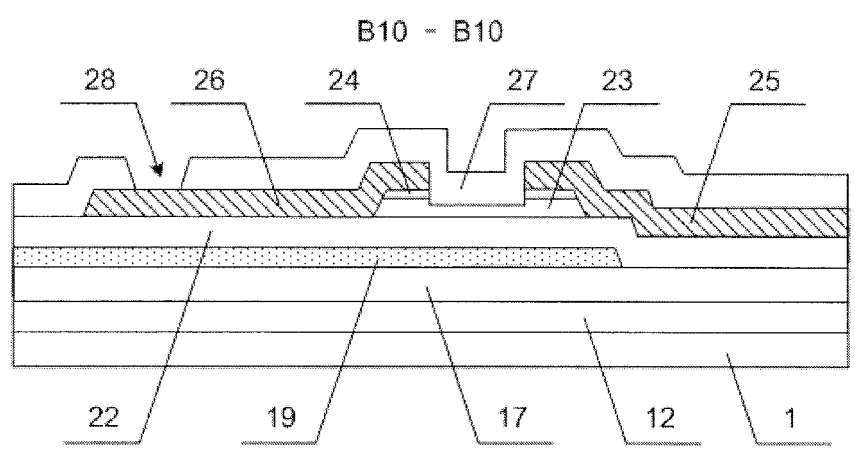
FIG. 33 is a cross-sectional view taken along the line B10-B10 in FIG. 33.

FIG. 32 is a planar view of the pixel structure of an AMOLED after a ninth patterning process according to the embodiment of the invention, showing a structure of one pixel unit. FIG. 33 is a cross-sectional view taken along the line B10-B10 in FIG. 33.

A fourth insulating layer 27, which can employ a material such as silicon nitride, silicon oxide or aluminum oxide, is deposited by a PECVD method. The fourth insulating layer 27 is patterned by a patterning process with a normal mask so as to form a second through hole 28. The second through hole 28 is disposed at a position corresponding to the second drain electrode 26. The fourth insulating layer 27 in the second through hole 28 is etched away so as to expose the surface of the second drain electrode 26, as shown in FIGS. 32 and 33.

Finally, on the substrate after forming the above patterns, a second transparent conductive film is deposited by a sputtering or thermal evaporation method. The second transparent conductive film may employ a material such as indium tin oxide, indium zinc oxide and aluminum zinc oxide, or may employ other transparent conductive material. The transparent conductive film may be patterned by a patterning process with a normal mask so as to form a second pixel electrode 29. The second pixel electrode 29 is connected with the second drain electrode 26 via the second through hole 28, as shown in FIGS. 1~5.

With the above process, the first thin film transistor, the second thin film transistor and the short-circuit-ring structure S1 in the pixel structure of the AMOLED according to the embodiment of the invention can be manufactured. The first thin film transistor used as an addressing element is located at the intersection of the gate line 2 and the signal line 4 and comprises the first gate electrode 11, the first active layer, the first source electrode 15, the first drain electrode 16 and the first TFT channel region. The first gate electrode 11 is formed on the substrate 1 and connected with the gate line 2. The first active layer is located above the first gate electrode 11. The first source electrode 15 is connected with the signal line 4, and the first drain electrode 16 is connected with the first pixel electrode 19 via the first through hole 18. The first pixel electrode 19 is used as the gate electrode of the second thin film transistor. The second thin film transistor used to control the OLED is located at the intersection of the gate line 2 and the power line 5. The second thin film transistor comprises the first pixel electrode 19, the second active layer, the second source electrode 25, the second drain electrode 26 and the second TFT channel region. The first pixel electrode 19 is used as the gate electrode of the second thin film transistor, and the second active layer is located above the first pixel electrode 19. The second source electrode 25 is connected with the power line 5, and the second drain electrode 26 is connected with the second pixel electrode 29 via the second through hole 28, so that the second thin film transistor can control the OLED to properly work. The short-circuit-ring structure S1 comprises the third thin film transistor 6, the fourth thin film transistor 7 and the fifth thin film transistor 8. The fifth thin film transistor 8 comprises the fifth gate electrode 51, the fifth active layer, the fifth source electrode 54, the fifth drain electrode 55 and the fifth TFT channel region. The fifth gate electrode 51 is connected with the signal line 4 via the fifth through hole 52 and the fifth connecting electrode 53, and the fifth source electrode 54 is connected with the signal line 4. The fourth thin film transistor comprises the fourth gate electrode 41, the fourth active layer, the fourth source electrode 44, the fourth drain electrode 45 and the fourth TFT channel region. The fourth gate electrode 41 is connected with the fifth drain electrode 55 of the fifth thin film transistor via the fourth through hole 42 and the fourth connecting electrode 43, and the fourth source electrode 44 is connected with the fifth drain electrode 55 of the fifth thin film transistor. The third thin film transistor comprises the third gate electrode 31, the third active layer, the third source electrode 34, the third drain electrode 35 and the third TFT channel region. The third gate electrode 31 is connected with the fourth drain electrode 45 of the fourth thin film transistor via the third through hole 32 and the third connecting electrode 33, the third source electrode 34 is connected with the fourth drain electrode 45 of the fourth thin film transistor, and the third gate electrode 31 is connected with the common electrode line 3, so that the third, fourth, and fifth thin film transistors may constitute the short-circuit-ring structure S1 between the signal line 4 and the common electrode line 3.

During the operation of the pixel structure of the AMOLED according to the embodiment of the invention, the signal line provides a data voltage, therefore, the voltage on the first pixel electrode becomes the data voltage from the signal line 4. A storage capacitance formed between the first pixel electrode and the common electrode line may sustain the data voltage, and the first pixel electrode is used as the gate electrode of the second thin film transistor. When the second thin film transistor is turned on, the second source electrode provides the current from the power line to the second pixel region via the second drain electrode. The first thin film transistor is used for addressing of the driving voltage, and the second thin film transistor is used to control the OLED. The threshold voltage of the thin film transistors in the short-circuit-ring structure is designed larger than the data voltage provided over the signal line, so as to ensure the short-circuit-ring properly work. When there is a large current due to electrostatic breakdown flowing through the signal line, the higher voltage on the signal line turns on the fifth thin film transistor since the signal line is connected with the fifth gate electrode and the fifth source electrode, thus the fifth drain electrode receives the higher voltage on the signal line. Since the fifth drain electrode is connected with the fourth gate electrode and the fourth source electrode, the higher voltage of the fifth drain electrode turns on the fourth thin film transistor, and therefore, the fourth drain electrode receives the higher voltage of the fifth drain electrode. Since the fourth drain electrode is connected with the third gate electrode and the third source electrode, the higher voltage of the fourth drain electrode turns on the third thin film transistor, and therefore, the third drain electrode receives the higher voltage of the fourth drain electrode. Meanwhile, the third gate electrode is connected with the common electrode line. Finally, the large current on the signal line is conducted to the common electrode line by sequentially turning on the fifth, fourth and third thin film transistors, so that the charges concentrated on the signal line can be released, the electrostatic breakdown phenomenon can be avoided and the signal line and the first thin film transistor are prevented from being damaged. Due to the direct connection between the signal line and the gate electrodes in the short-circuit-ring structure according to the embodiment of the invention, the short-circuit-ring structure can be used after the thin film transistors are formed. It should be noted that, for the above embodiment of the invention, the short-circuit-ring structure is described by taking three thin film transistors as an example. However, the short-circuit-ring structure according to the embodiment of the invention may be composed of two or more thin film transistors connected sequentially.

One manufacturing method with normal masks for the pixel structure of the AMOLED is described in the above. However, the embodiment of the invention may be realized by adding or reducing the patterning times, selecting different materials or combination of the materials. For example, the seventh and the eighth processes may be combined into one patterning process using a half tone or grey tone mask, which is often used in the field of manufacture of liquid crystal display and will not be repeated herein.

The embodiment of the invention provides a pixel structure of an AMLED. By providing a short-circuit-ring structure, which comprises at least two thin film transistors, between a signal line and a common electrode line, when there is a large current due to the electrostatic discharge on the signal line, the large current on the signal line can be conducted to the common electrode line by sequentially turns on the several thin film transistors. Thus, the charges concentrated on the signal line can be released, the electrostatic breakdown is avoided and the signal line and the first thin film transistor are prevented from being damaged. Due to the direct connection between the signal line and the gate electrodes in the short-circuit-ring structure according to the embodiment of the invention, the short-circuit-ring structure can be used after manufacturing the thin film transistors. Comparing with the case in which the short-circuit-ring structure is completed only after the pixel electrode is formed, the short-circuit-ring structure of the embodiment of the invention can protect the circuit more efficiently and prevent the damage due to the electrostatic breakdown.

The method of manufacturing the pixel structure of the AMOLED according to the embodiment of the invention mainly comprises the following steps.

Step 1, depositing films to be patterned on a substrate, forming a gate line, a common electrode line, a signal line, a first thin film transistor, a first pixel electrode and a short-circuit-ring structure, the short-circuit-ring structure that is posed between the signal line and the common electrode line.

Step 2, forming films to be patterned on the substrate, forming a power line, a second thin film transistor and a second pixel electrode, the first pixel electrode being used as a gate electrode of the second thin film transistor.

The embodiment of the invention provides a manufacturing method of a pixel structure of an AMLED. By providing a short-circuit-ring structure between a signal line and a common electrode line, when there is a large current due to electrostatic discharge on the signal line, the large current on the signal line can be conducted to the common electrode line by sequentially turns on the several thin film transistors. Thus, the charges concentrated on the signal line are released, the electrostatic breakdown is avoided and the signal line and the first thin film transistor are prevented from being damaged. In addition, due to the direct connection between the signal line and the gate electrodes in the short-circuit-ring structure according to the embodiment of the invention, the short-circuit-ring structure can be used after manufacturing the thin film transistors. Comparing the case in which the short-circuit-ring structure is completed only after forming the pixel electrode, the short-circuit-ring structure of the embodiment of the invention can protect the circuit more efficiently and prevent the damage due to the electrostatic breakdown.

According to a first example of the invention, Step 1 in the manufacturing method of the pixel structure of the AMOLED comprises the following steps.

Step 11, depositing a first metal film on the substrate, forming the gate line, the common electrode line, a first gate electrode and short-circuit-ring gate electrodes by a patterning process.

Step 12, depositing a first insulating layer on the substrate after Step 11, forming short-circuit-ring through holes above the short-circuit-ring gate electrodes by a patterning process.

Step 13, depositing a first semiconductor film and a first doped semiconductor film sequentially on the substrate after Step 12, forming a first active layer above the first gate electrode, and forming short-circuit-ring active layers above the short-circuit-ring gate electrodes by a patterning process.

Step 14, depositing a second metal film on the substrate after Step 13, forming the signal line, a first source electrode, a first drain electrode and a first TFT channel region, and forming short-circuit-ring source/drain electrodes and short-circuit-ring connecting electrodes by a patterning process.

Step 15, forming a second insulating layer on the substrate after Step 14, forming a first through hole provided at a position corresponding to the first drain electrode by a patterning process.

Step 16, depositing a transparent conductive film on the substrate after Step 15, forming the first pixel electrode by a patterning process, the first pixel electrode being connected with the first drain electrode via the first through hole.

The above Step 11 may comprise: depositing the first metal film on the substrate by a magnetron sputtering or thermal evaporation method, patterning the first metal film by a patterning process with a normal mask so as to form the gate line, the common electrode line, the first gate electrode, and the short-circuit-ring gate electrodes which comprise a third gate electrode, a fourth gate electrode and a fifth gate electrode. The first gate electrode is connected with the gate line, the common electrode line is disposed between two adjacent gate lines, the third gate electrode is connected with the common electrode line, and the fourth gate electrode and the fifth gate electrode are disposed in this order on one side of the third gate electrode.

The above Step 12 may comprise: on the substrate after Step 11, depositing the first insulating layer by a plasma enhanced chemical vapor deposition (PECVD) method, and patterning the first insulating layer by a patterning process with a normal mask, so as to form the short-circuit-ring through holes which comprise a third through hole, a fourth through hole and a fifth through hole. The third through hole is located at a position corresponding to the third gate electrode, the fourth through hole is located at a position corresponding to the fourth gate electrode, and a fifth through hole is located at a position corresponding to the fifth gate electrode.

The above Step 13 may comprise: on the substrate after Step 12, depositing a first semiconductor film and a first doped semiconductor film sequentially by a PECVD method, and forming the first active layer and the short-circuit-ring active layers by a patterning process with a normal mask. The short-circuit-ring active layers comprise a third active layer, a fourth active layer and a fifth active layer. The first active layer is located above the first gate electrode, the third active layer is located above the third gate electrode, the fourth active layer is located above the fourth gate electrode, and the fifth active layer is located above the fifth gate electrode.

The above Step 14 may comprise: depositing the second metal film by a magnetron sputtering or thermal evaporation method, patterning the second metal film by a patterning process with a normal mask, so as to form the signal line, the first source electrode, the first drain electrode, the first TFT channel region, and the short-circuit-ring source/drain electrodes, and the short-circuit-ring connecting electrodes. One end of the first source electrode is disposed on the first active layer, and the other end is connected with the signal line 4. One end of the first drain electrode is disposed on the first active layer and disposed oppositely to the first source electrode. The first TFT channel region is formed between the first source electrode and the first drain electrode. The short-circuit-ring source/drain electrodes comprise the source/drain electrodes of the third thin film transistor, the source/drain electrodes of the fourth thin film transistor, and the source/drain electrodes of the fifth thin film transistor. The short-circuit-ring connecting electrodes comprise the third connecting electrode, the fourth connecting electrode, and the fifth connecting electrode. The source/drain electrodes of the fifth thin film transistor comprise a fifth source electrode and a fifth drain electrode, one end of the fifth connecting electrode is connected with the signal line, and the other end is located above the fifth gate electrode and connected with the fifth gate electrode via the fifth through hole. One end of the fifth source electrode is located on the fifth active layer, and the other end is connected with the signal line; one end of the fifth drain electrode is located on the fifth active layer and disposed oppositely to the fifth source electrode; the fifth TFT channel region is formed between the fifth source electrode and the fifth drain electrode. The source/drain electrodes of the fourth thin film transistor comprise a fourth source electrode and a fourth drain electrode; one end of the fourth connecting electrode is connected with the fifth drain electrode, and the other end is located above the fourth gate electrode and connected with fourth gate electrode via the fourth through hole; one end of the fourth source electrode is located on the fourth active layer, and the other end is connected with the fifth drain electrode; one end of the fourth drain electrode is located on the fourth active layer and disposed oppositely to the fourth source electrode; the fourth TFT channel region is formed between the fourth source electrode and the fourth drain electrode. The source/drain electrodes of the third thin film transistor comprise a third source electrode and a third drain electrode; one end of the third connecting electrode is connected with the fourth drain electrode, and the other end is located above the third gate electrode and connected with the third gate electrode via the third through hole; one end of the third source electrode is located on the third active layer, and the other end is connected with the fourth drain electrode; one end of the third drain electrode is located on the third active layer and disposed oppositely to the third source electrode; the third TFT channel region is formed between the third source electrode and the third drain electrode. In addition, the third gate electrode is connected with the common electrode line.

The manufacturing process according to the embodiment has been described in detail with reference to FIGS. 6~27, which will not be repeated herein.

According to a second example of the manufacturing method of the pixel structure of the AMOLED, the above Step 2 may comprise the following.

Step 21, depositing a third insulating layer, a second semiconductor film and a second doped semiconductor film on the substrate after Step 1, forming a second active layer above the first pixel electrode by a patterning process;

Step 22, depositing a third metal film on the substrate after Step 21, forming the power line, a second drain electrode, a second drain electrode and a second TFT channel region by a patterning process. One end of the second source electrode is disposed on the second active layer, and the other end is connected with the power line; one end of the second drain electrode is located on the second active layer; the second TFT channel region is formed between the second source electrode and the second drain electrode.

Step 23, depositing a fourth insulating layer on the substrate after Step 22, forming a second through hole disposed at a position corresponding to the second drain electrode by a patterning process.

Step 24, depositing a transparent conductive film on the substrate after Step 23, forming the second pixel electrode by a patterning process, the second pixel electrode being connected with the second drain electrode via the second through hole.

The manufacturing process of the embodiment has been described in detail with reference to FIGS. 28~33, which will not be repeated herein.

The invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A pixel structure of an active matrix organic light emitting display (AMOLED) comprising a gate line, a common electrode line, a signal line, a power line, a first thin film transistor which is used as an addressing element, and a second thin film transistor which controls an organic light emitting diode, wherein a short-circuit-ring structure is connected between the common electrode line and the signal line, and the short-circuit-ring structure communicates the signal line and the common electrode line in the case where a large current flows.

2. The pixel structure of the AMOLED of claim 1, wherein the short-circuit-ring structure comprises a thin film transistor, and wherein the common electrode line is connected with a gate electrode and a source electrode of the thin film transistor, and the signal line is connected with a drain electrode of the thin film transistor.

3. The pixel structure of the AMOLED of claim 1, wherein the short-circuit-ring structure comprises a thin film transistor, and wherein the signal line is connected with a gate electrode and a source electrode of the thin film transistor, and the common electrode line is connected with a drain electrode of the thin film transistor.

4. The pixel structure of the AMOLED of claim 1, wherein the short-circuit-ring structure comprises at least two thin film transistors connected sequentially.

5. The pixel structure of the AMOLED of claim 1, wherein the short-circuit-ring structure comprises a third thin film transistor and a fifth thin film transistor, and wherein the common electrode line is connected with a third gate electrode and a third source electrode of the third thin film transistor, the signal line is connected with a fifth gate electrode and a fifth source electrode of the fifth thin film transistor, and a third drain electrode of the third thin film transistor is connected with a fifth drain electrode of the fifth thin film transistor.

6. The pixel structure of the AMOLED of claim 1, wherein the short-circuit-ring structure comprises a third thin film transistor, a fourth thin film transistor and a fifth thin film transistor, the common electrode line is connected with a third gate line and a third source electrode of the third thin film transistor, the signal line is connected with a fifth gate electrode and a fifth source electrode of the fifth thin film transistor, and the fourth thin film transistor is connected between the third thin film transistor and the fifth thin film transistor.

7. The pixel structure of the AMOLED of claim 6, wherein the fifth thin film transistor comprises:
    the fifth gate electrode which is connected with the signal line;
    a fifth active layer is formed above the fifth gate electrode;
    the fifth source electrode, one end of which is located on the fifth active layer, and the other end of which is connected with the signal line;
    a fifth drain electrode, one end of which is located on the fifth active layer and disposed oppositely to the fifth source electrode; and
    a fifth TFT channel region, which is formed between the fifth source electrode and the fifth drain electrode.

8. The pixel structure of the AMOLED of claim 7, wherein a first insulating layer is formed on the fifth gate electrode, a fifth connecting electrode is formed on the first insulating layer; and one end of the fifth connecting electrode is connected with the signal line, the other end of the fifth connecting electrode is connected with the fifth gate electrode via a fifth through hole provided in the first insulating layer.

9. The pixel structure of the AMOLED of claim 8, wherein the fourth thin film transistor comprises:
    a fourth gate electrode connected with the fifth drain electrode of the fifth thin film transistor;
    a fourth active layer is formed above the fourth gate electrode;
    a fourth source electrode, one end of which is located on the fourth active layer, and the other end of which is connected with the fifth drain electrode of the fifth thin film transistor;
    a fourth drain electrode, one end of which is located on the fourth active layer and disposed oppositely to the fourth source electrode; and
    a fourth TFT channel region, which is formed between the fourth source electrode and a fourth drain electrode.

10. The pixel structure of the AMOLED of claim 6, wherein the fourth thin film transistor comprises:
    a fourth gate electrode connected with the fifth drain electrode of the fifth thin film transistor;
    a fourth active layer is formed above the fourth gate electrode;
    a fourth source electrode, one end of which is located on the fourth active layer, and the other end of which is connected with the fifth drain electrode of the fifth thin film transistor;
    a fourth drain electrode, one end of which is located on the fourth active layer and disposed oppositely to the fourth source electrode; and
    a fourth TFT channel region, which is formed between the fourth source electrode and a fourth drain electrode.

11. The pixel structure of the AMOLED of claim 9, wherein the first insulating layer is formed on the fourth gate electrode, a fourth connecting electrode is formed on the first insulating layer; one end of the fourth connecting electrode is connected with the fifth drain electrode of the fifth thin film transistor, and the other end of the fourth connecting electrode is connected with the fourth gate electrode via a fourth through hole provided in the first insulating layer.

12. The pixel structure of the AMOLED of claim 11, wherein the third thin film transistor comprises:
    a third gate electrode connected with the fourth gate electrode of the fourth thin film transistor;
    a third active layer is formed above the third gate electrode;
    a third source electrode, one end of which is located on the third active layer, and the other end of which is connected with the fourth drain electrode of the fourth thin film transistor;
    a third drain electrode, one end of which is located on the third active layer and disposed oppositely to the third source electrode; and
    a third TFT channel region, which is formed between the third source electrode and the third drain electrode.

13. The pixel structure of the AMOLED of claim 12, wherein the first insulating layer is formed on the third gate electrode, a third connecting electrode is formed on the first insulating layer; one end of the third connecting electrode is connected with the fourth drain electrode of the fourth thin film transistor, and the other end of the fourth connecting electrode is connected with the third gate electrode via a third through hole provide in the first insulating layer.

14. The pixel structure of the AMOLED of claim 13, wherein the third, fourth and fifth gate electrodes are disposed at a same layer and formed by a same patterning process with a first gate electrode of the first thin film transistor.

15. The pixel structure of the AMOLED of claim 13, wherein the third, fourth and fifth active layers are formed by a same patterning process with a first active layer of the first thin film transistor.

16. The pixel structure of the AMOLED of claim 13, wherein the third source electrode, the third drain electrode, the fourth source electrode, the fourth drain electrode, the fifth source electrode, and the fifth drain electrode are disposed at a same layer and formed by a same patterning process with a first source electrode and a first drain electrode of the first thin film transistor.

17. The pixel structure of the AMOLED of claim 13, wherein the third, fourth and fifth TFT channel regions are formed by a same patterning process with a first TFT channel region of the first thin film transistor.

18. The pixel structure of the AMOLED of claim 13, wherein the third, fourth and fifth connecting electrodes are disposed at a same layer and formed by a same patterning process.

19. The pixel structure of the AMOLED of claim 4, wherein the threshold voltage of the thin film transistors in the short-circuit-ring structure is set as a value larger than the data voltage provided in the signal line.

* * * * *